US007002913B2

(12) United States Patent
Huang et al.

(10) Patent No.: US 7,002,913 B2
(45) Date of Patent: Feb. 21, 2006

(54) PACKET LOSS COMPENSATION METHOD USING INJECTION OF SPECTRALLY SHAPED NOISE

(75) Inventors: Ying Huang, Ottawa (CA); Rafik Goubran, Ottawa (CA); Dieter Schulz, Kanata (CA)

(73) Assignee: Zarlink Semiconductor Inc., (CA)

( * ) Notice: Subject to any disclaimer, the term of this patent is extended or adjusted under 35 U.S.C. 154(b) by 909 days.

(21) Appl. No.: 09/764,746

(22) Filed: Jan. 18, 2001

(65) Prior Publication Data

US 2001/0028634 A1 Oct. 11, 2001

(30) Foreign Application Priority Data

Jan. 18, 2000 (GB) .................................... 0001157

(51) Int. Cl.
*H04J 1/16* (2006.01)
*G01R 31/08* (2006.01)

(52) U.S. Cl. ................... 370/230.1; 370/231; 370/254; 370/360; 370/389; 455/570; 455/67.1; 375/240; 375/240.03; 375/240.04; 375/240.11; 375/245; 375/246

(58) Field of Classification Search ................ 370/229, 370/230.1, 231, 254, 360, 389; 455/570, 455/67.1; 375/240, 240.03, 240.04, 240.11, 375/245, 246

See application file for complete search history.

(56) References Cited

U.S. PATENT DOCUMENTS

| | | | | |
|---|---|---|---|---|
| 5,486,833 | A | 1/1996 | Barrett | |
| 5,615,214 | A | 3/1997 | Chandos et al. | |
| 5,615,298 | A * | 3/1997 | Chen | 704/228 |
| 5,818,929 | A | 10/1998 | Yaguchi | |
| 5,970,441 | A | 10/1999 | Mekuria | |
| 6,459,914 | B1 * | 10/2002 | Gustafsson et al. | 455/570 |

FOREIGN PATENT DOCUMENTS

| | | |
|---|---|---|
| EP | 0673018 | 9/1995 |
| EP | 0756267 | 1/1997 |
| GB | 2235611 | 3/1991 |

* cited by examiner

*Primary Examiner*—Wellington Chin
*Assistant Examiner*—Raj K. Jain
(74) *Attorney, Agent, or Firm*—Jones Day

(57) ABSTRACT

An insertion-based error concealment method and apparatus are provided whereby, instead of directly inserting white noise, a filter is created to shape the white noise. The filtered white noise is then used to replace lost data. The method of the present invention is implemented by first estimating the power spectrum of the previous frame; then designing a filter with transfer function H(f), where $|H(f)|^2$=the estimated power spectrum; and finally generating the replacement packet using noise which has been spectrally modified by the filter. The resulting filtered noise has the same power spectrum as the previous packet but is not highly correlated with it.

5 Claims, 3 Drawing Sheets

PACKET LOSS COMPENSATION METHOD USING INJECTION OF SPECTRALLY SHAPED NOISE

FIELD OF THE INVENTION

This invention relates in general to packetized voice communication systems, and more particularly to a method of compensating for lost packets in a packetized voice system by injecting spectrally shaped noise.

BACKGROUND OF THE INVENTION

Transmission of voice over packet networks has emerged in recent years as a replacement for traditional legacy PBX systems for telephone communications. A packetized voice transmission system comprises a transmitter and a receiver. The transmitter collects voice samples and groups them into packets for transmission across a network to the receiver. The data itself may be companded according to u-law or A-law, as defined in ITU-T specification G.711. Other companding/vocoding techniques, such as G.729, G.723.1, can also be used.

When using a packet based network, packet losses due to congestion in the network can produce significant degradation of the performance of echo cancellers. The effects introduced by packet loss depend to a large extent on the techniques used to recover lost packets. Packet loss recovery techniques can be divided into two classes: sender-based repair and receiver-based repair [see C. Perkins, O. Hodson and V. Hardman, "A Survey of Packet Loss Recovery Techniques for Streaming Audio," IEEE Network, Sep./Oct. 1998, pp. 40–48]. Receiver-based repair is also referred to in the art as error concealment.

Among known error concealment techniques, those based on packet insertion have found popularity due to ease of implementation. According to such insertion-based recovery techniques a replacement packet is inserted to fill the gap left by a lost packet. The replacement packet can be one of either silence, white noise or repetition of the previous packet. Silence substitution is simple to implement but performs poorly. Since silence substitution fills the gap left by a lost packet with silence in order to maintain the timing relationship between the surrounding packets, the performance of silence substitution degrades rapidly as packet sizes increases, and quality is unacceptably bad for the 40 ms packet size in common use in network audio conferencing tools. Some studies have shown that inserting white noise, instead of silence, can improve intelligibility [see G. A. Miller and J. C. R. Licklider, "The Intelligibility of Interrupted Speech," *J. Acoust. Soc. Amer.*, vol. 22, no. 2, 1950, pp. 167–73; and R. M. Warren, *Auditory Perception,* Pergamon Press, 1982].

Among the three methods of packet insertion, repetition of the previous packet gives best voice quality due to the similarity between the neighboring voice segments.

Although the uses of white noise and previous packets may yield better speech quality than silence substitution does, these techniques interfere with proper operation of network echo cancellers. The substitution of white noise results in a sudden change in the spectral characteristics of the signal, causing severe degradation of echo return loss enhancement (ERLE). When substituting a previous packet, the fill-in packet is the same as the previous packet, which means that the two packets are highly correlated. This reduces the convergence rate and results in slow recovery from the packet loss.

SUMMARY OF THE INVENTION

According to the present invention, a new insertion-based error concealment method and apparatus are provided whereby, instead of directly inserting white noise, a filter is created to shape the white noise. The filtered white noise is then used to replace lost data. The method of the present invention is implemented by first estimating the power spectrum of the previous frame; then designing a filter with transfer function H(f), where $|H(f)|^2$=the estimated power spectrum; and finally generating the replacement packet using noise which has been spectrally modified by the filter. The resulting filtered noise has the same power spectrum as the previous packet but is not highly correlated with it.

BRIEF DESCRIPTION OF THE DRAWINGS

A detailed description of a preferred embodiment of the present invention is provided herein below with reference to the drawings in which.

DETAILED DESCRIPTION OF THE PREFERRED EMBODIMENT

Figure 1:
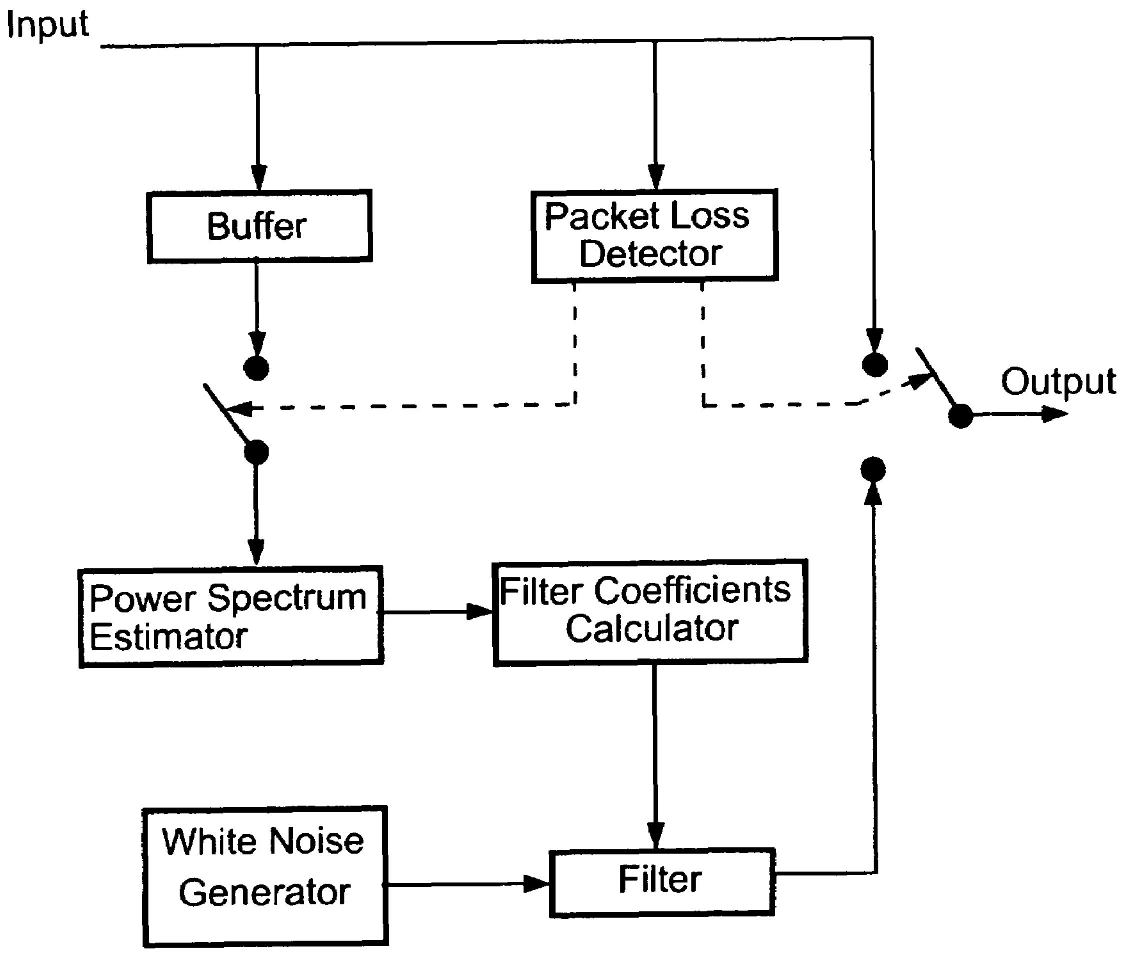
FIG. 1 is a block diagram showing a lost packet generator for use in a data packet transmission system according to the present invention.
Figure 2:
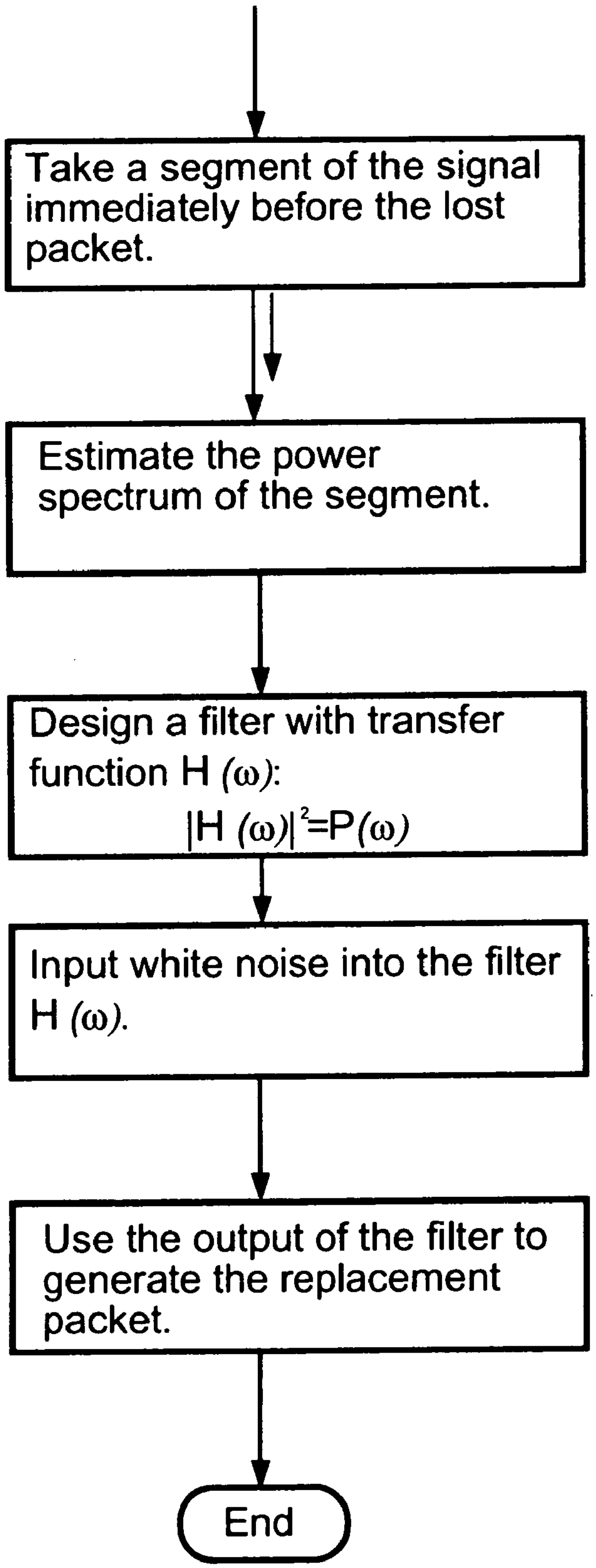
FIG. 2 is a flowchart showing steps in the lost packet compensation method of the present invention.

With reference to FIGS. 1 and 2, a new apparatus and method are shown according to the preferred embodiment, for packet loss compensation in a voice communication system. A buffer 3 receives and stores successive frames of received voice data. A packet loss detector 5 detects lost packets and in response operates a pair of switches 7 and 9, as discussed in greater detail below. The design and operation of buffer 3 and packet loss detector 5 will be well known to a person of ordinary skill in the art and are not, therefore, discussed in further detail herein.

In response to detecting a lost packet, switch 7 closes and the previous voice packet stored in buffer 3 is applied to power spectrum estimator 11. Power estimator 11 implements Welch's averaged periodogram method for estimating the power signal P(ω), (see P. D. Welch, "The Use of Fast Fourier Transform for the Estimation of Power Spectra", IEEE Trans. Audio Elecrtoacoust., Vol AU-15, June 1970, pp. 70–73), although any spectral estimation algorithm will suffice. The output of the spectrum estimator is sent to a filter coefficients calculator 13. The filter coefficients calculator 13 designs an FFT filter 15 with transfer function H(f), where $|H(f)|^2$=the estimated power spectrum. filter coefficients calculator 13 and filter 15 may be implemented using a digital signal processor (DSP) using well known techniques. According to a successful implementation a 64 bit FFT was used. White noise is output from generator 17 to the filter 15 so that the shapes the white noise to the characteristics of the voice signal. As indicated above, packet loss detector 5 operates switch 9 so that in response to a lost packet, the filtered noise from filter 15 is output to replace lost data. The filtered noise has the same power spectrum as the previous frame. Due to the similarity between the neighboring frames, the filtered noise is more similar to the lost packet than unfiltered white noise is.

Figure 3:
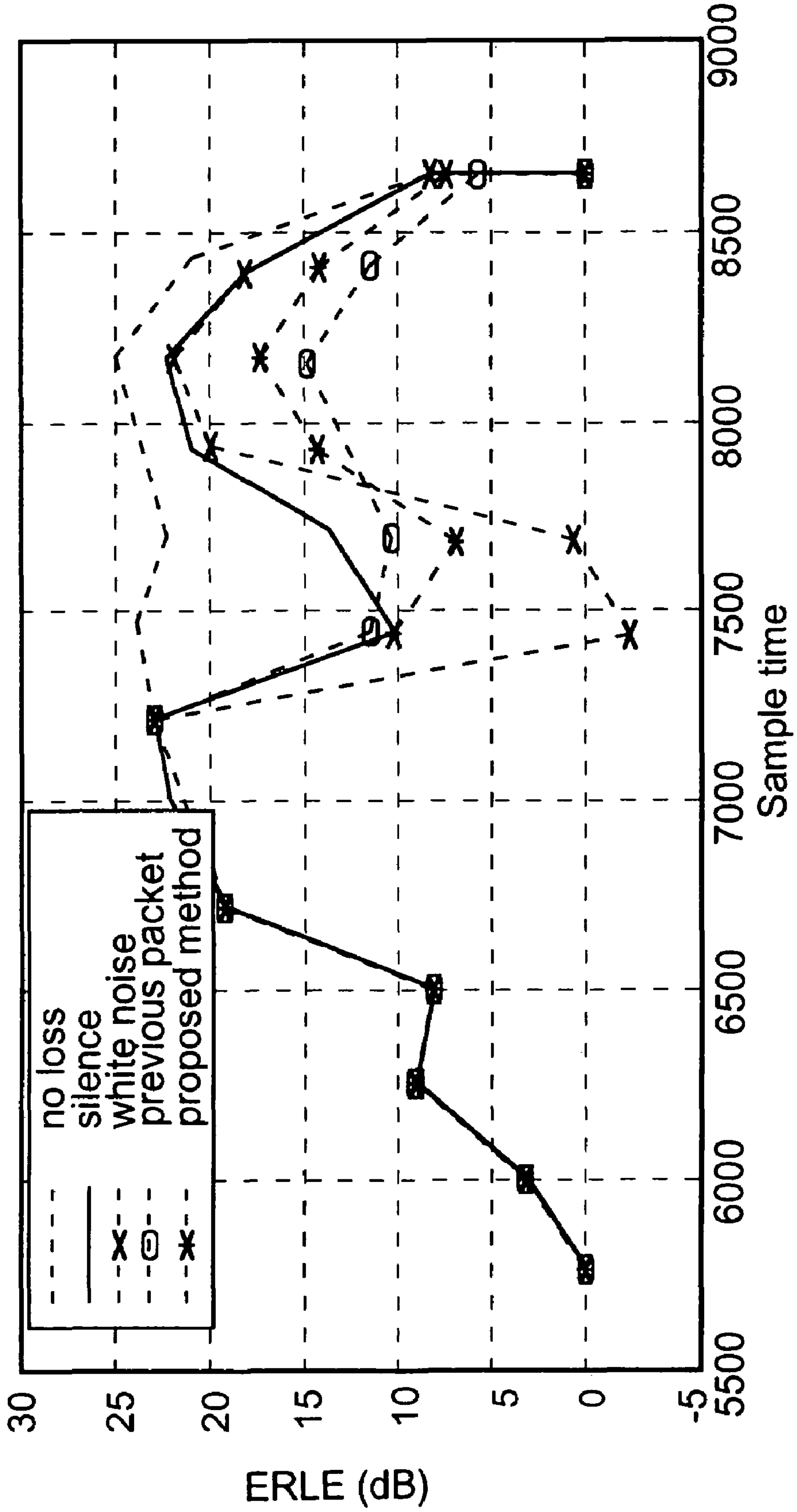
FIG. 3 is a graph showing a comparison of the impact of packet loss compensation on ERLE using the method and apparatus of the present invention with the prior art.

FIG. 3 shows the comparative ERLE performance of the lost packet compensation method of the present invention relative to other techniques. It can be seen that inserting silence and white noise exhibit the smallest and greatest impact on the ERLE performance, respectively. However, the degradation of ERLE is smaller using the system according to the present invention than when using substitution of white noise, and the impact on ERLE decays quicker compared to the substitution of previous packets.

Alternative embodiments and variations of the invention are possible. For example, although the inventive method and apparatus have been described in terms of voice transmission over IP networks, it is contemplated that the principles of the invention may be extended to other asynchronous systems such as ATM networks. Also, whereas the preferred embodiment sets forth the use of Welch's algorithm and an FFT filter for spectral estimation and filtering, respectively, it is possible to use other spectral estimation algorithms (e.g. Linear Predictive Coding (LPC)), and other filtering (e.g. using LPC coefficients).

All such changes and modifications may be made without departing from the sphere and scope of the invention as defined by the claims appended hereto.

What is claimed is:

1. A method of compensating for lost packets in a packet based voice communication system, comprising the steps of:

storing successive packets of a packetized voice signal;

detecting a missing voice packet from said voice signal;

estimating the power spectrum $P(\omega)$ of a stored one of said packets previous to said missing voice packet;

creating a filter with transfer function $|H(\omega)|^2=P(\omega)$;

applying white noise to said filter for generating a noise packet which has the same power spectrum as said stored one of said packets; and inserting said noise packet in said voice signal to replace said missing voice packet.

2. The method of claim 1, wherein said step of estimating said power spectrum comprises performing Welch's averaged periodogram method on said stored one of said packets.

3. A system to compensate for lost packets in a packet based voice communication system, comprising:

a buffer for storing successive packets of a packetized voice signal;

a packet loss detector for detecting a missing voice packet from said voice signal;

a power spectrum estimator for estimating the power spectrum $P(\omega)$ of a stored one of said packets previous to said missing voice packet;

a filter coefficients generator for receiving said power spectrum from said power spectrum estimator and in response creating a filter with transfer function $|H(\omega)|^2=P(\omega)$;

a white noise generator for applying white noise to said filter which in response generates a noise packet which has the same power spectrum as said stored one of said packets; and a switch operable by packet loss detector for inserting said noise packet in said voice signal to replace said missing voice packet.

4. The system of claim 3, further comprising an additional switch operable by said packet loss detector and connected between said buffer and said power spectrum estimator.

5. The system of claim 3, wherein said power spectrum estimator implements Welch's averaged periodogram method on said stored one of said packets.

* * * * *